United States Patent [19]

Lorenz et al.

[11] 4,135,007
[45] Jan. 16, 1979

[54] RADIATION CURABLE COATING COMPOSITION COMPRISING AN ACRYL URETHANE OLIGOMER, AND AN ULTRA-VIOLET ABSORBER

[75] Inventors: Donald H. Lorenz, Basking Ridge; Shu T. Tu, E. Brunswick; Donald P. Wyman, Wayne, all of N.J.

[73] Assignee: GAF Corporation, New York, N.Y.

[21] Appl. No.: 865,664

[22] Filed: Dec. 29, 1977

[51] Int. Cl.² .................. B05C 5/00; B05C 17/04
[52] U.S. Cl. .................. 427/44; 204/159.14; 204/159.16; 204/159.18; 204/159.19; 204/159.23; 260/45.85 E; 427/54; 428/332; 428/412; 428/425; 428/522; 526/260; 526/312; 526/328
[58] Field of Search .......... 427/44, 54; 204/159.16, 204/159.189, 159.23; 260/45.85 E

[56] References Cited

U.S. PATENT DOCUMENTS

| | | | |
|---|---|---|---|
| 3,970,639 | 7/1976 | Cordes et al. | 260/45.85 A |
| 4,013,806 | 3/1977 | Volkert et al. | 427/54 |
| 4,019,972 | 4/1977 | Faust | 204/159.15 |
| 4,039,720 | 8/1977 | Chevrenko et al. | 428/425 |

*Primary Examiner*—Richard B. Turer

*Attorney, Agent, or Firm*—Walter C. Kehm; Joshua J. Ward

[57] ABSTRACT

A radiation curable coating comprising;
A. an oligomer of Formula I:

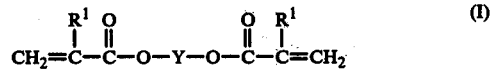

wherein:
$R^1$ is hydrogen or methyl;
Y is a divalent urethane residue;
B. a benzylidene acid ester of Formula IV:

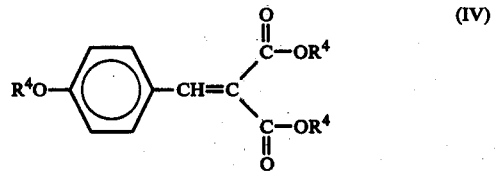

wherein $R^4$ is independently alkyl or hydroxy alkylene. Preferably the coating composition contains a vinyl monomer copolymerizable with the oligomer. The process for curing the coating is also disclosed.

4 Claims, 6 Drawing Figures

LIGHT TRANSMISSION OF PVC GLAZING
(3-mil films, cured under UV)

YELLOWNESS INDEX OF PVC GLAZING
(3-mil films, cured under UV)

LIGHT TRANSMISSION OF PVC GLAZING
(Coating, containing 3% CYASORB on one side of PVC, cured under UV)

YELLOWNESS INDEX OF PVC GLAZING
(Coating containing 3% CYASORB on one
side of PVC, cured under UV)

LIGHT TRANSMISSION OF PVC GLAZING
(Coating thickness 1-1.5 mils on both sides of PVC, electron beam cured)

YELLOWNESS INDEX OF PVC GLAZING
(Coating thickness 1-1.5 mils on both sides of PVC, electron beam cured)

RADIATION CURABLE COATING COMPOSITION COMPRISING AN ACRYL URETHANE OLIGOMER, AND AN ULTRA-VIOLET ABSORBER

CROSS REFERENCE TO RELATED APPLICATION

U.S. application Ser. No. 865,663, filed Dec. 29, 1977, concurrently with this application disclosing and claiming different but related subject matter.

Coating compositions which are curable under the influence of radiation in general and ultra-violet light as well as electron beam in particular are well known. Representative examples of prior coating compositions include those disclosed in U.S. Pat. Nos. 3,782,961; 3,829,531; 3,850,770; 3,874,906; 3,864,133; 3,891,523; 3,895,171; 3,899,611; 3,907,574; 3,912,516; 3,932,356; and 3,989,609. Unfortunately, these coating compositions suffer from a number of disadvantages and do not have an in situ ultra-violet absorber in the composition. Many of these coating compositions have insufficient flexibility that causes them to crack when applied to flexible substrates such as those of polyvinyl chloride. Other compositions do not adhere sufficiently to the substrate with the undesirable result that they become dislodged or peel. Still other coating compositions require the use of solvents that must be evaporated during the curing process. The evaporation of such solvents consumes energy and creates atmospheric pollution problems. Other compositions produce coatings that yellow, do not weather well, and have insufficient scratch-resistance, stain-resistance, abrasion-resistance, and/or solvent-resistance.

The use of ultra-violet absorbers in plastics or coatings to enhance weather resistance is known. The absorbers absorb the radiation and dissipate the energy and thus protect the coating from structural degradation. Considerable economic saving is realized by incorporating the ultra-violet absorber on the surface of a plastic article rather than using the ultra-violet absorber in conventional bulk application. Conventional surface application, such as the use of a solvent or paint vehicle is, moreover, undesirable in view of the pollution hazard and bulk handling procedures. Radiation curing has made possible production of coating films which are easier to handle, but heretofore ultra-violet absorbers have consumed the energy from the radiation source resulting in too high energy demands in curing or too slow curing rates. If a small amount of ultra-violet photoinitiator is used to facilitate curing, then addition of use levels of most ultra-violet stabilizers would prevent the curing from occurring.

Accordingly it is an object of the present invention to provide an improved coating composition that is substantially free of one or more of the disadvantages of prior radiation curable coating compositions.

Yet another object is to provide a coating composition that will produce a coating that is weather-resistant, non-yellowing, scratch-resistant, stain-resistant, abrasion-resistant, and solvent-resistant.

Yet another object is to provide a coating composition that is free of volatile solvents.

Another object is to provide an improved process for coating substrates such as those of natural leather, synthetic leather, polyvinyl chloride, polyurethanes, and polycarbonates.

Still another object is to provide a coating composition with an ultra-violet absorber which can be cured by radiation.

Other objects and advantages of the present invention will be apparent to those skilled in the art by reference to the following detailed description.

Figure 1:
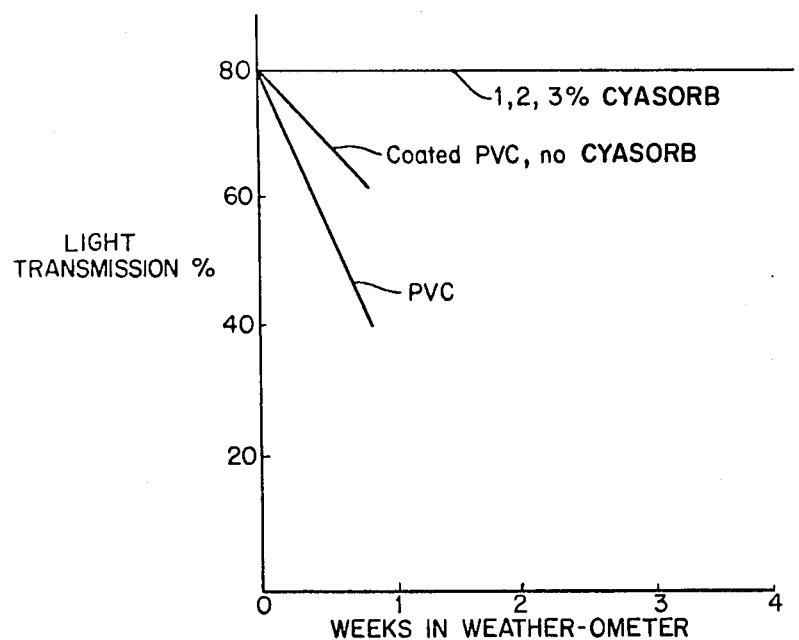
FIG. 1 is a graph of light transmission of polyvinyl chloride (hereinafter PVC) glazing.

The above and other objects are accomplished according to the present invention by providing a coating composition comprising:

A. an oligomer of Formula I:

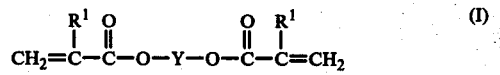

wherein:
$R^1$ is hydrogen or methyl;
Y is a divalent urethane residue;

B. a benzylidene acid ester ultra-violet light absorber of Formula IV:

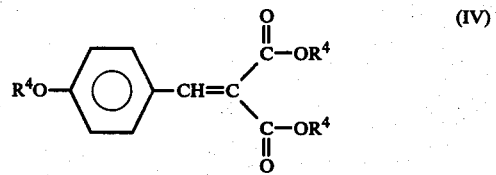

wherein $R^4$ is independently alkyl or hydroxy alkylene. Preferably a vinyl monomer or monomers are included which are copolymerizable with the oligomer. Oligomers of Formula I with an acrylic or methacrylic component are well known in the art. Oligomers of this type are shown in U.S. Pat. Nos. 3,907,574; 3,874,906; 3,989,609; and 3,895,171. A preferred type of oligomer contains both an acrylic component and a urethane portion in the Y radical. Examples of these compounds are found in U.S. Pat. Nos. 3,912,516; 3,891,523; 3,864,133; and 3,850,770.

Preferred novel types of acryl urethane are shown by Formulas II and III:

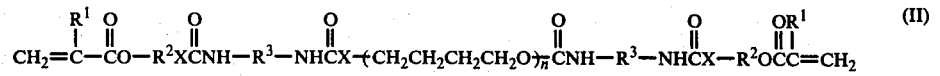

-continued

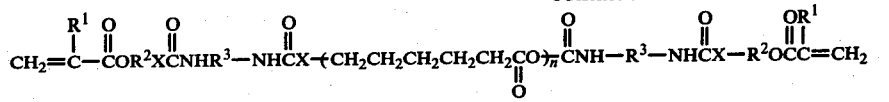

wherein:
R[1] is hydrogen or methyl;
R[2] is lower alkylene;
R[3] is aliphatic or cycloaliphatic;
X is —O— or —NH—;
n is an integer from 2 to 50 inclusive.

These oligomers are produced by reacting polytetrahydrofuran, polycaprolactone polyols and other polyols with a diisocyanate to produce an isocyanate terminated prepolymer. The isocyanate terminated prepolymer is then capped with a capping agent to produce the oligomer of Formula II and Formula III. The preferred oligomers of Formula II are those of Formula V and the preferred oligomers of Formula III are those of Formula VI:

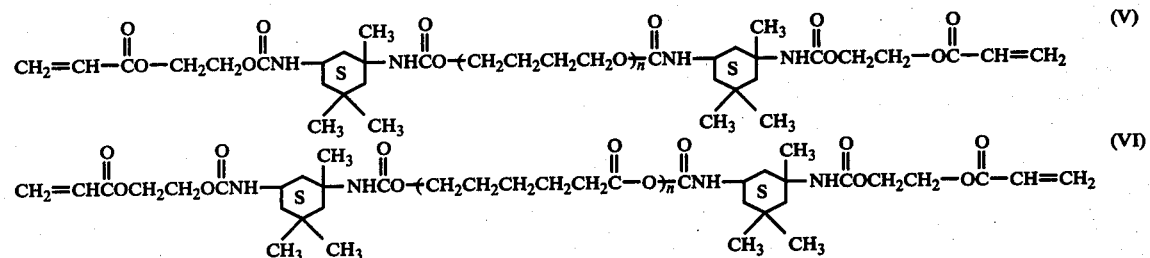

wherein "n" is an integer from 5 to 20 inclusive.

The polytetrahydrofuran is commercially available from the Du Pont Company under the tradenames "TERRECOL-650", "TERRECOL-1000", and "TERRECOL-2000", and from the Quaker Oats Company under the tradenames "POLYMEG-650", "POLYMEG-1000", and "POLYMEG-2000". In the above tradenames the number indicates the approximate molecular weight of the polytetrahydrofuran. The most preferred polytetrahydrofuran is that having a molecular weight of 650 which is consistent with the definition of "n" in Formulas II and V herein. At higher molecular weights wherein "n" exceeds about 50 the resultant oligomer has too high a viscosity.

The caprolactone polyols are commercially available from Union Carbide Corp. under the tradenames "NIAX CAPROLACTONE POLYOLS" — PCP-0200, PCP-0210, PCP-0230, PCP-0240, PCP-0300, PCP-0301 and PCP-0310. The 0200 series are diols with molecular weights 530, 830, 1250 and 2000 respectively. The 0300 series are triols with molecular weights 540, 300 and 900 respectively.

The oligomers of Formula II, III, V, and VI can be produced in accordance with U.S. patent application, Ser. No. 777,031 filed Mar. 4, 1977. The capping agents useful in the present invention are those that will react with the isocyanate terminated prepolymer to produce the oligomers of Formula II. In general, any capping agent having a terminal amine or hydroxyl group and also having an acrylic acid or methacrylic acid moiety is suitable. Examples of suitable capping agents include among others hydroxyethyl acrylate, hydroxyethyl methacrylate, hydroxypropyl acrylate, hydroxypropyl methacrylate, hydroxybutyl acrylate, hydroxybutyl methacrylate, hydroxypentyl acrylate, hydroxypentyl methacrylate, hydroxyhexyl acrylate, hydroxyhexyl methacrylate, aminoethyl acrylate, and aminoethyl methacrylate.

The diisocyanates useful to produce oligomers of Formula II are aliphatic and cycloaliphatic diisocyanates that will react with terminal hydroxyl groups present on the polytetrahydrofuran. Of course, aromatic diisocyanates undergo the same reaction but do not yield a product as satisfactory as that obtained by the use of aliphatic diisocyanates. Examples of suitable diisocyanates include among others, isophorone diisocyanate, 4,4'-dicyclohexylmethane-diisocyanate available commercially from the Du Pont Company under the trade name "Hylene W", and trimethyl-hexamethylene-diisocyanate, 1,6 hexamethylene diisocyanate, 2,4,4 trimethyl 1,6 hexylene diisocyanate, octadecylene diisocyanate and 1,4 cyclohexylene diisocyanate. The preferred diisocyanates are isophorone diisocyanate (3-isocyanatomethyl 3,5,5 trimethyl cyclohexyl isocyanate) and 4,4' dicyclohexylmethane-diisocyanate.

The vinyl monomer copolymerizable with the oligomer may be one or more monomers compatible with the oligomer selected. N-vinyl-2 pyrrolidone and acrylic acid esters having a boiling point of at least 200° C. at 760 mm Hg are preferred. These monomers allow adjustment of the viscosity for ease of coating operations and N-vinyl-2-pyrrolidones also enhance the rate of curing.

The weight ratio of oligomer to N-vinyl-2-pyrrolidone can vary widely as long as the properties of the resultant cured coating composition are not adversely affected, however, they are generally present in a weight ratio of 1:9 to 9:1 and preferably 1:3 and 3:1. At higher ratios, e.g., those rich in oligomer, the uncured coating composition tends to have too high a viscosity. This high viscosity makes it difficult to apply the uncured coating composition to the substrate. At lower ratios the resultant cured coating composition tends to be too hard and inflexible.

The acrylic acid ester should have a boiling point of at least 200° C. at 760 mm Hg. Acrylic acid esters of lower boiling points tend to vaporize during curing. Such vaporization causes undesirable changes in the coating composition. Furthermore, vaporized acrylic acid esters tend to polymerize on the radiation source, e.g., ultra-violet lamps or electron beam window. This vaporization also causes undesirable atmospheric pollution. The acrylic acid esters useful in the present invention include, among others, monoesters, diesters and higher esters of both acrylic acid and methacrylic acid. Examples of suitable acrylic acid esters include, among others, 1,4-butanedioldiacrylate, 1,6-hexanedioldiacrylate, neopentylglycoldiacrylate, pentaerythritol-tetramethacrylate, trimethylolpropane-triacrylate, ethylhexyl-acrylate, ethylhexylmethacrylate, pentyl-acrylate, hexyl-acrylate, and cyclohexylmethacrylate. 1,4-butanedioldiacrylate and 1,6 hexanedioldiacrylate are the preferred acrylic acid esters.

The acrylic acid ester can be present in the coating composition in widely varying amounts but is generally present in a weight ratio of 1:9 to 9:1 and preferably 1:3 to 3:1 compared to the oligomer of Formula I or II.

The benzylidene acid ester ultra-violet light absorber is of Formula IV:

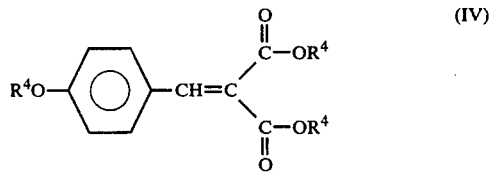

wherein $R^4$ is independently alkyl or hydroxyalkyl. The $R^4$ group may be methyl, ethyl, propyl, iso-propyl, butyl, pentyl, hexyl, octyl, etc., and the corresponding hydroxy alkylenes. Alkyl groups with 1 to 12 carbon atoms, and preferably 1-8 carbon atoms are used. The compounds are referred to as Cyasorbs. If the $R^4$'s are methyl groups, the compound is P-methoxy benzylidene malonic acid dimethyl ester and is designated Cyasorb 1988. It is commercially available from American Cyanamid. It is believed that the hydroxy alkylene versions of these compounds can be readily synthesized in a manner analogous to the products produced by American Cyanamid by selecting the appropriate starting material; for example, esterifying malonic acid with a dihydric alcohol or using an hydroxy alkoxy benzylidene.

The amount of ultra-violet absorber of the above formula in the coating compositions for radiation curing can vary from 0.5 to 3%. Lesser amounts do not give a coating that retains the light transmission or low yellowness of the coating. Greater amounts retard the curing to an unacceptable level.

If the curing is done with ultra-violet light a photoinitiator is used. Suitable photo-initiators include vicinal ketaldonyl compounds (i.e., compounds containing a ketone group and an aldehyde group) such as diacetyl, benzil; 2,3-pentanedione,2,3-octanedione,1-phenyl-1,2-butanedione, 2,2-dimethyl-4-phenyl-3,4-butanedione, phenyl-glyoxal, diphenyl-triketone; aromatic diketones, such as anthraquinone; acyloins, such as benzoin; pivaloin acryloin ethers, such as benzoin-methyl-ether, benzoin-ethyl-ether, benzoin-butyl-ether, benzoin-isobutyl-ether, benzoin-phenyl-ether; alpha-hydrocarbon substituted aromatic acyloins, including alpha-methyl-methylbenzoin, alpha-alkyl-benzoin, as in U.S. Pat. No. 2,722,512, and phenylbenzoin; diaryl ketones, such as benzophenone and dinaphthyl ketone; and organic disulfides, such as diphenyldisulfide. The photo-initiator can also include a synergistic agent, such as a tertiary amine, to enhance the conversion of photo-absorbed energy to polymerization initiating free radicals. Diethoxyacetophenone available from Union Carbide Corp., dimethoxyphenylacetophenone such as IRGACURE 651 available from Ciba-Geigy or a benzoin ether such as Vicure 10 available from Stauffer Chemical Co. are preferred. The photo-initiator is present in the coating composition in an amount sufficient to initiate the desired polymerization under the influence of the amount of actinic light energy absorbed. The coating composition generally contains from 0.01 to 5 weight percent of photo-initiator based on the weight of the coating composition.

The coating composition can also contain an addition polymerization inhibitor to prevent undesirable auto-polymerization of the coating composition in storage prior to use. Examples of suitable addition polymerization inhibitors include, among others, di(1,4 sec-butylamino) benzene available from the Du Pont Company under the trade name "Anti-Oxidant 22" and phenothiazine available from Tefenco Chemical Co. The addition polymerization inhibitor is present in an amount sufficient to prevent auto-polymerization and is generally present in an amount from 100–300 PPM based on the weight of the coating composition.

The coating composition can also contain a surfactant. The preferred surfactants are silicone surfactants such as that available from the Dow Corning Corporation under the trade name "DC-193". The surfactant is present in an amount necessary to reduce the surface tension of the coating composition and reduce its viscosity to the desired level. The surfactant generally comprises from 0.1 to 5 weight percent based on the weight of the coating composition.

The coating compositions of the present invention can also contain other conventional additives, such as flow control and leveling agents, organic and inorganic dyestuffs and pigments, fillers, plasticizers, lubricants, and reinforcing agents, such as alumina, silica, clay, talc, powdered glass, carbon black and fiberglass.

The coating compositions of the present invention can be cured by applying them as a film 0.5 mil thick on the substrate. Curing is preferably done under an inert atmosphere of nitrogen. The coating composition may be applied as a thin film in any conventional manner such as by spraying, brushing, dipping, roll coating and the like.

Conventionally, the film on the substrate is positioned to travel on a conveyor and pass under a source of a free radical generator, such as radiation. The coated side of the substrate is exposed to the radiation for a time sufficient to effect polymerization and convert the film into an adherent, tough, flexible coating.

As used herein the term radiation refers to any radiation source which will produce free radicals and induce addition polymerization of vinyl bonds. The actinic radiation is suitably in the wave length of 2000-7500 A, preferably 2000 to 4000. A class of actinic light useful herein is ultra-violet light and other forms of actinic radiation are from the sun, artificial sources such as Type RS sunlamps, carbon arc lamps, Xenon arc lamps, mercury vapor lamps, tungsten halide lamps, lasers, fluorescent lamps with ultra-violet light emitting phosphors.

Ultra-violet curing rates greater than 20 ft/min/lamp must be obtained in order to be commercially acceptable. With a reasonable thickness (less than 10 mils) coating the coating compositions with the ultra-violet absorber of Formula IV, present in an amount from 0.5 to 3% based on the weight of the composition, can be cured at rates of 25-50 ft/min/lamp.

The preferred electron beam system contains a wide curtain of electrons directly from a linear cathode. A curtain of electrons from the gun's cathode, accelerated to a high velocity by a 200 KV potential, emerges from the chamber through a foil window into the coated substrates (Electroncurtain ™ by Energy Sciences, Inc.).

The electron beam curing of the coating compositions as described above is cured at less than 5 Mrads and generally at 2 Mrads. Curing at greater than 8 Mrads is deemed unacceptable because of the high cost.

Laminates of film coatings based on acryl urethanes with an ultra-violet absorber of benzylidene acid ester applied on clear polycarbonate are surprisingly non-leachable and do not yellow.

The invention is further illustrated by the following examples in which all parts and percentages are by weight unless otherwise indicated. These non-limiting examples are illustrative of certain embodiments designed to teach those skilled in the art how to practice the invention and to represent the best mode contemplated for carrying out the invention.

The following abbreviations are used in the following examples and tables:

reaction mixture is lowered to 50 ± 2° C. and Item E is added dropwise from the other funnel. The addition takes about 45 min. to complete. The temperature is raised to 56 ± 2°0 C. where it is kept for 3 hours. At the end of the reaction Item F (3% on the product weight) is mixed in. Silicone oil may be added. The product is stored in an amber glass bottle at the ambient temperature. For electron beam curing, the product is ready for use. For ultra-violet light curing, a photo-initiator is added and mixed well before use.

EXAMPLES 2–4

These examples are illustrative of forming the inventive coating compositions. Table I shows the amounts of ingredients combined in the examples. The procedure of Example 1 was followed substituting the specified amounts of ingredients as shown in Table I. The amounts of ingredients in Example 1 are also shown in Table I for convenience.

TABLE I

| EXAMPLE | 1 Parts | Mos | 2 Parts | Mols | 3 Parts | Mols | 4 Parts | Mols |
|---|---|---|---|---|---|---|---|---|
| THF | 356 | 0.55 | 356 | 0.55 | 356 | 0.55 | 356 | 0.55 |
| NP | 173.3 | 1.56 | 186.3 | 1.68 | 190.3 | 1.71 | 172.1 | 1.55 |
| B,DDA | 121.7 | 0.61 | 128.6 | 0.65 | 131.6 | 0.66 | 119.5 | 0.60 |
| diisocyanate | 267 (IPDI) | 1.20 | 315 (Hylene W) | 1.20 | 315 (Hylene W) | 1.20 | 253 (TMDI) | 1.20 |
| capping agent | 139 (HEA) | 1.20 | 139 (HEA) | 1.20 | 156 (HEMA) | 1.20 | 139 (HEA) | 1.20 |
| u-v absorber | 31.7 (Cyasorb 1988) | | 33.7 (Cyasorb 1988) | | 34.5 (Cyasorb 1988) | | 31.2 (Cyasorb 1988) | |

| | |
|---|---|
| THF | polytetrahydrofuran |
| NP | N-vinyl-2 pyrrolidone |
| B,DDA | 1,4 butanedioldiacrylate |
| IPDI | isophorone diisocyanate |
| TMDI | trimethyl hexamethylene diisocyanate |
| Hylene W | 4,4' dicyclohexylmethane diisocyanate |
| HEA | hydroxyethyl acrylate |
| HEMA | hydroxyethyl methacrylate |
| Cyasorb 1988 | p-methoxybenzylidene malonic acid dimethyl ester |
| PCP | polycaprolactone polyol |

EXAMPLE 1

This example is illustrative of forming the inventive coating composition based on THF/IPDI/HEA Oligomer. The quantities of the following items were combined as indicated below:

| | | QUANTITY | |
|---|---|---|---|
| ITEM | NAME | (gms) | (mols) |
| A | THF | 356 | 0.55 |
| B | NP | 173.3 | 1.56 |
| C | B,DDA | 121.7 | 0.61 |
| D | IPDI | 267 | 1.20 |
| E | HEA | 139 | 1.20 |
| F | Cyasorb 1988 | 31.7 | |

The following procedure was used: The reaction is carried out under dry air. Items B, C and D are added to a reactor equipped with a mechanical stirrer, a reflux condenser and two separatory funnels. Phenothiazine (0.06g) is added. This mixture is agitated vigorously at a temperature of 45° C. At this point, 2.4 ml. of a 10 weight percent solution of catalyst of dibutyl tin dilaurate in ethylhexyl acrylate is injected. The temperature is raised to 50 ± 2° C. and Item A is added dropwise from a separatory funnel. This addition takes approximately 40 min. Another 1.6 ml. of the catalyst is then injected and the temperature is raised to 56 ± 2° C., where it is kept for 2 hours. The temperature of the

EXAMPLE 5

This example illustrates the synthesis of a coating composition of the present invention employing two acrylic acid esters.

The procedure of Example 1 is repeated employing the same times, conditions and ingredients except that one-half the quantity of mols of the B,DDA is replaced with ethylhexylacrylate with similar results.

EXAMPLE 6

This example illustrates applying the inventive coating composition to a vinyl sheet. To the composition of Example 4 is added 2% of a benzoin ether (Vicure 10 available from Stauffer Chemical) and a 1-mil thick film is applied on a vinyl sheet. The coated vinyl sheet is cured by passing through a PPG QC Lab UV oven containing two 200 w/in. UV lamps at a speed of 100 ft/min/2 lamps. No solvent was left after the cure. The coating is dry, flexible, scratch-resistant, stain-resistant, abrasion-resistant, and solvent-resistant. The curing rate is 75 ft/min/2 lamps.

The product has been shown to give coatings with good hand on fabrics. The elongation of the cured film is in the order of 20–50% with a tensile strength of about 3500 psi. These materials have good adhesion to vinyl, urethane and polycarbonate substrates as well as to natural fibers.

EXAMPLE 7

This example is not representative of the present invention. The procedure of Example 6 is followed with a coating composition similar to Example 1 with the single exception that Uvinul 400, i.e., 2,4-dihydroxybenzophenone, was used in place of the Cyasorb 1988 ultraviolet absorber. The curing rate is 40/ft/min/2 lamps. This speed is considered too slow for most commercial applications.

EXAMPLE 8

This example is illustrative of forming the inventive coating based on PCP-200/IPDI/HEA oligomer. The procedure is the same as described in Example 1, except that 292 grams of PCP-200 is used replacing 356 grams of poly THF-650.

EXAMPLES 9-13

These examples are illustrative of curing the inventive composition under an electron beam. The composition of Examples 1 to 4 and 8 (with the photo-initiator omitted), and with the percentages of ultra-violet absorber as indicated in Table II. The coating compositions are applied to a thickness of 1-1.5 mils on each side of a sheet of PVC. One Mrad was sufficient to cure the coatings in all cases.

TABLE II

| EXAMPLE | 9 | 10 | 11 | 12 | 13 |
|---|---|---|---|---|---|
| ultra-violet absorber weight percent | 3% | 3% | 3% | 3% | 3% |
| Coating Comp. of Example | 1 | 2 | 3 | 4 | 8 |

EXAMPLE 14

The same procedure of Examples 9-13 was followed with the single exception that the inventive composition was applied to a sheet of polycarbonate glazing. Similar results were obtained.

For adequate outdoor protection it was found that, after ultra-violet curing a 3 mil. film containing 1-3% Cyasorb 1988 on one side of a commercial PVC glazing of 110 mil. thickness is weather-resistant after an exposure period of four weeks in a Weather-Ometer.

FIG 1. shows that the light transmission for coated PVC containing Cyasorb 1988 remains constant while the light transmission for untreated PVC decreases and for coated PVC without ultra-violet absorbers also decreases.

Figure 2:
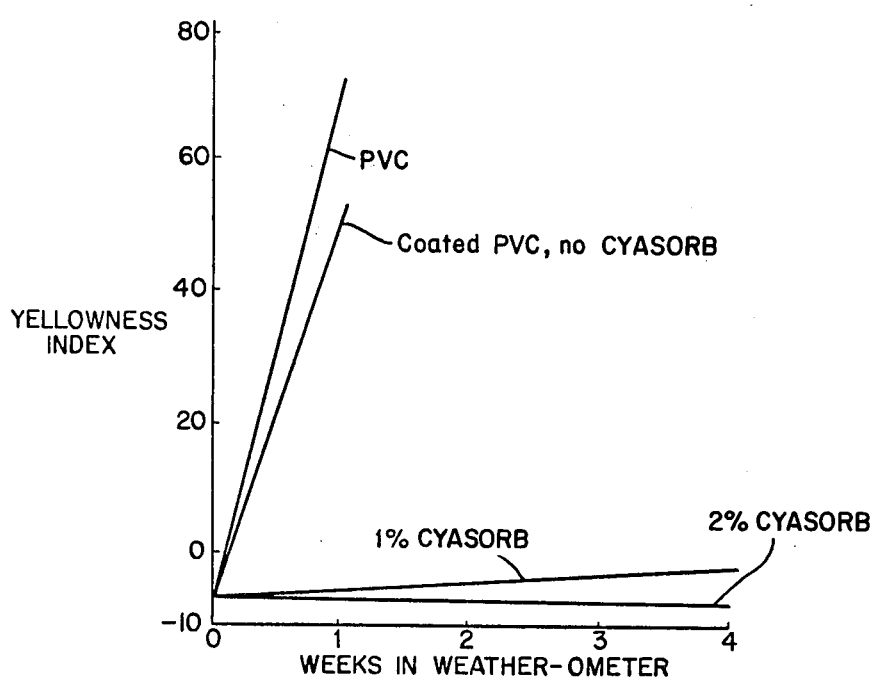
FIG. 2 is a graph of yellowness index of PVC glazing.

FIG. 2 shows that the PVC glazings with no ultraviolet absorber exhibit yellowing. After 4 weeks in a Weather-Ometer the PVC had a yellowness index of over 70; the coated PVC containing no Cyasorb over 50 and the coated PVC containing 1 or 2% of Cyasorb 1988 showed no yellowness.

Figure 3:
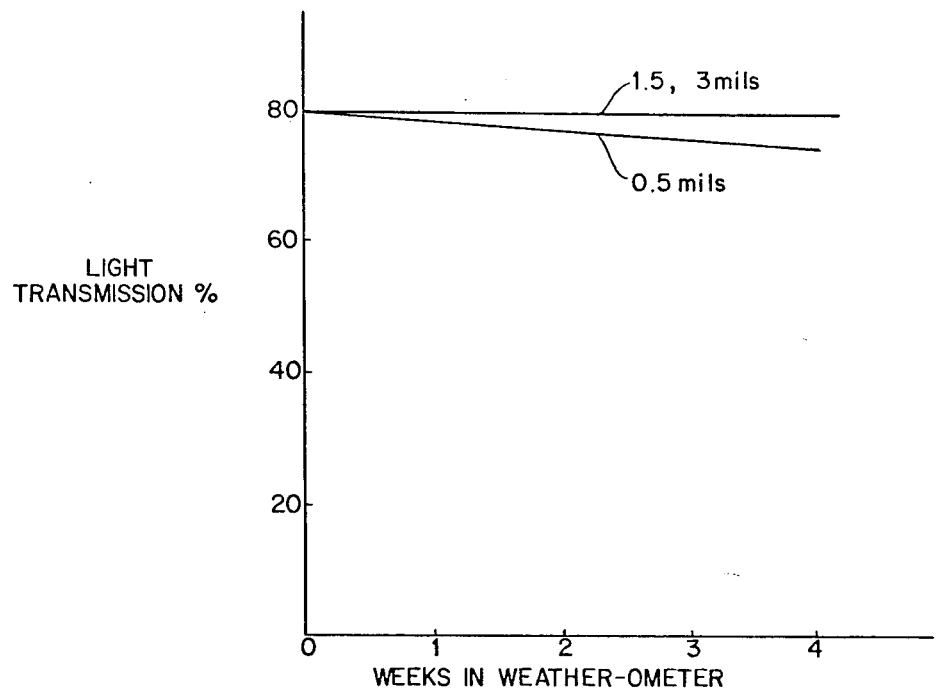
FIG. 3 is a graph of light transmission of PVC glazing wherein the coating with ultra-violet absorber has different thicknesses. The coating is UV cured.

FIG. 3 shows that the light transmission diminishes only slightly with a decrease in thickness of the coating composition containing 3% of Cyasorb 1988 on one side of a coated PVC cured under ultra-violet light. Coatings of a thickness of 1.5 mils performed as well as 3 mil coatings. Coatings of 0.5 mils showed only a slight decrease in the percentage of light transmission.

Figure 4:
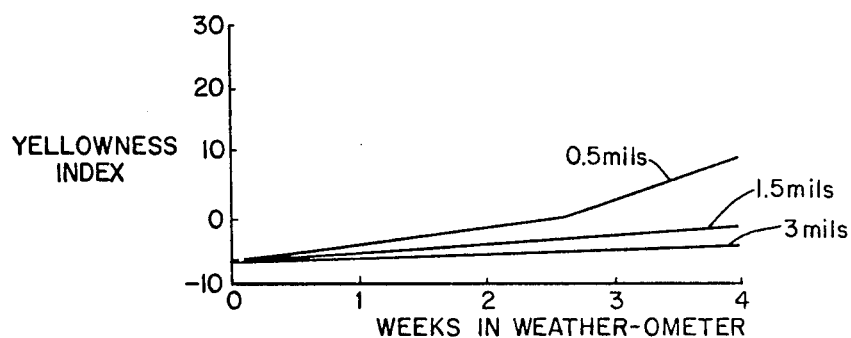
FIG. 4 is a graph of yellowness index of PVC glazing coated with a composition containing an ultra-violet absorber and of different thicknesses. The coating is UV cured.

FIG. 4 shows the yellowness index for PVC glazing coated with a coating composition with 3% Cyasorb 1988 one one side of the sheet and cured under UV. Sheets with coatings of 0.5 mils showed a yellowness index of approximately 10; sheets with coatings of 1.5 mils and 3 mils showed little measureable yellowness.

Figure 5:
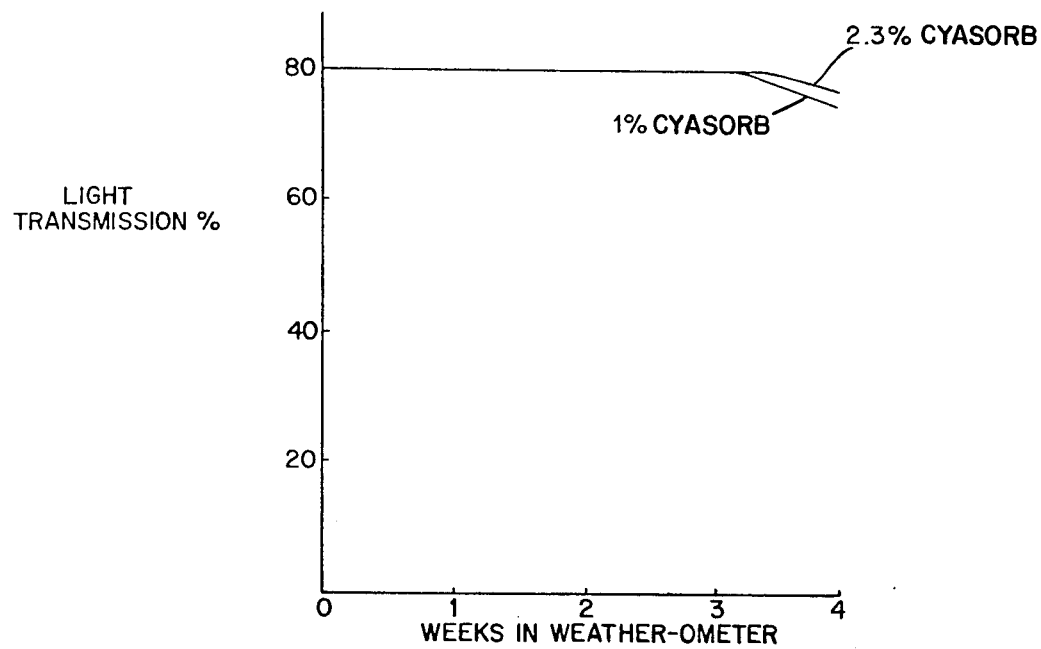
FIG. 5 is a graph of the light transmission of PVC coated with ultra-violet absorbers. The coating is electron beam cured.

FIG. 5 shows similar results for a PVC glazing coated on both sides with a coating composition containing Cyasorb 1988 cured by electron beam. The thickness of the coating on each side varied between 1 and 1.5 mils. The coating containing 1% of Cyasorb 1988 showed a greater decrease in light transmission than the coating containing 2.3% of Cyasorb 1988.

Figure 6:
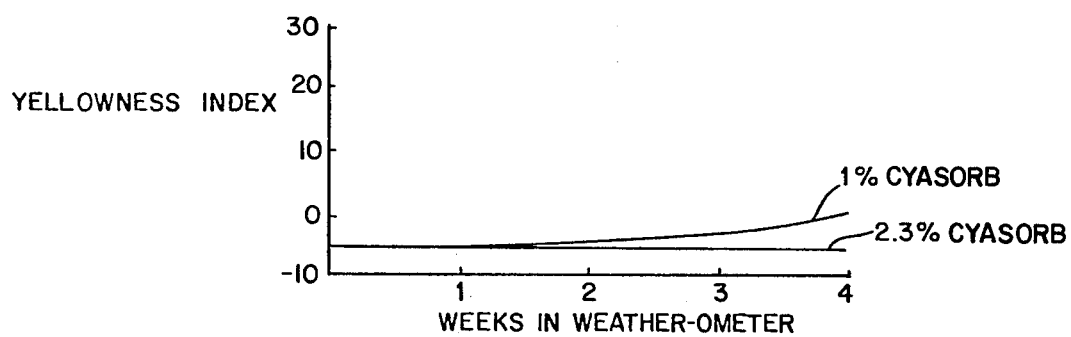
FIG. 6 is a graph of yellowness index of PVC glazing with a coating containing ultra-violet absorbers. The coating is electron beam cured.

FIG. 6 shows a stability against yellowness for a PVC glazing with a coating thickness of 1 to 1.5 mils on both sides of the glazing and cured by electron beam. Only the coating containing 1% of Cyasorb 1988 showed a slight yellowness. The coating containing 2.3% of Cyasorb 1988 showed no yellowness.

Table III shows additional test results indicating that the coating composition gives a strong, stain-resistant, solvent-resistant and adhesive coating which is the same for the coating with and without the ultra-violet light absorbers. Thus ultra-violet absorbers in a radiation curable coating improve weathering to a surprising extent without a loss of other desirable properties.

TABLE III

| | PHYSICAL PROPERTIES OF THE WEATHER-RESISTANT COATING | | | | | |
|---|---|---|---|---|---|---|
| | Pencil Hardness ASTM D01.53.02 | Impact Strength (NBS PS55-74) in.-lb. | Tabor Abrasion (ASTM D1044-56) Wt.Loss,mg. | Stain Resistance DuPont Yellow Stain, 30 Min. | Acetone Resistance (ASTM D-1308-57 | Dry and Wet Adhesion, % (ASTM D-3002-71 |
| PVC Glazing (110 mils) | HB* | 80 | — | No Stain | No | — |
| Plexiglas (100 mils) | H** | 8 | — | No Stain | No | — |
| Lexan Glazing (57 mils) | 3B*** | 208 | — | No Stain | No | — |
| Coating, no Cyasorb one mil film on PVC | HB | 64-78 | 10±4 | No Stain | Resistant | 10 |
| Coating Containing Cyasorb 1988, one mil film on PVC | HB | 64-72 | 10±4 | No Stain | Resistant | 10 |

HB = Midpoint
H = Soft
B = Hard

Although the invention has been described in considerable detail with reference to certain preferred embodiments thereof, it will be understood that variations and modifications can be effected within the spirit and scope of the invention as described above and as defined in the appended claims.

What is claimed is:

1. A process for coating a substrate comprising in sequence the steps of:
   I. contacting the substrate with a coating composition comprising:
      A. an oligomer of Formula I:

$$CH_2=C-C-O-Y-O-C-C=CH_2 \quad \text{(I)}$$
$$\phantom{CH_2=}\overset{R^1}{|}\,\overset{O}{\|}\phantom{-O-Y-O-}\overset{O}{\|}\,\overset{R^1}{|}$$

wherein:
   $R^1$ is hydrogen or methyl;
   Y is a divalent urethane residue;

B. a benzylidene acid ester ultra-violet light absorber of the Formula IV:

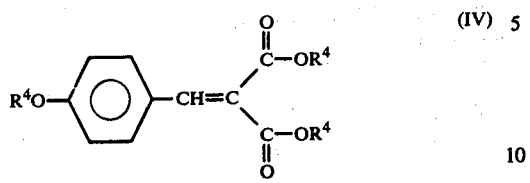

wherein $R^4$ is independently alkyl or hydroxy alkylene;
C. a photoinitiator to form a coated substrate wherein the amount of B. is 0.5 to 3 weight percent based on the weight of the composition,
II. exposing the coated substrate to actinic radiation until an adherent dry polymerized weather-resistant coating is formed on the substrate.

2. A process of claim 1 wherein the actinic radiation is ultra-violet light.

3. A process of claim 1 wherein the curing is effected at a speed of 25-50 ft/min/lamp.

4. A process for coating a substrate comprising in sequence the steps of:

I. contacting the substrate with a coating composition comprising:
A. an oligomer of Formula I:

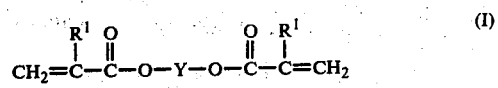

wherein:
$R^1$ is hydrogen or methyl;
Y is a divalent urethane residue;
B. an acrylic ultra-violet light absorber of the Formula IV:

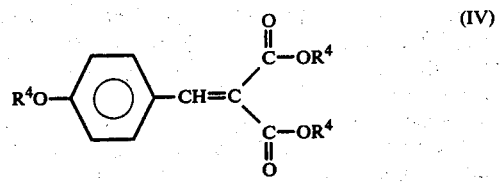

wherein $R^4$ is independently alkyl or hydroxy alkylene;
II. exposing the coated substrate to an electron beam until an adherent dry polymerized weather-resistant coating is formed on the substrate.

* * * * *